(12) United States Patent
Dees et al.

(10) Patent No.: US 9,026,945 B2
(45) Date of Patent: May 5, 2015

(54) METHOD OF GROUPING WAVEFORMS FOR A SINGLE CHANNEL ON A SINGLE DISPLAY

(75) Inventors: Ian S. Dees, Aloha, OR (US); Ngoc Giao Tran, Beaverton, OR (US); Amy M. Bergsieker, Tigard, OR (US); Gary J. Waldo, Hillsboro, OR (US); Steven C. Herring, Beaverton, OR (US); Tony Lee Tarr, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 456 days.

(21) Appl. No.: 13/436,597

(22) Filed: Mar. 30, 2012

(65) Prior Publication Data

US 2012/0278763 A1 Nov. 1, 2012

Related U.S. Application Data

(60) Provisional application No. 61/480,280, filed on Apr. 28, 2011.

(51) Int. Cl.
*G06F 3/048* (2013.01)
*G09G 5/00* (2006.01)
*G01R 13/02* (2006.01)

(52) U.S. Cl.
CPC .......... *G01R 13/0236* (2013.01); *G01R 13/029* (2013.01)

(58) Field of Classification Search
CPC .... G01R 13/0236; G01R 13/029; G09G 5/00; G06T 11/60
USPC ................ 715/763, 835; 345/619; 702/66–68
See application file for complete search history.

(56) References Cited

U.S. PATENT DOCUMENTS

| 5,371,842 | A  | * | 12/1994 | Easton et al. | ................. | 345/440 |
| 6,320,577 | B1 | * | 11/2001 | Alexander | ................. | 345/440.1 |
| 6,778,931 | B1 | * | 8/2004 | Letts et al. | .................... | 702/117 |
| 8,655,617 | B1 | * | 2/2014 | Biagiotti et al. | .............. | 702/120 |

(Continued)

FOREIGN PATENT DOCUMENTS

| DE | 102006001871 A1 | 11/2006 |
| DE | 102008005885 A1 | 7/2009 |

(Continued)

OTHER PUBLICATIONS

Extended European Search Report for European Patent Application No. 12164760.6, Sep. 28, 2012, Berlin, 7 pages.

(Continued)

*Primary Examiner* — Tadeese Hailu
(74) *Attorney, Agent, or Firm* — Francis I. Gray; Thomas F. Lenihan; Marger Johnson & McCollom PC

(57) ABSTRACT

A method of grouping multiple waveforms for a single channel of acquired data on a display area uses a graphic icon with the display area. The graphic icon has a first portion with a symbol indicating the single channel and with an indicator defining a baseline for the display area. The graphic icon also has a second portion with symbols indicating which of the multiple waveforms currently are being displayed. The symbol for the single channel and the symbol for a selected one of the multiple waveforms currently being displayed are highlighted. The highlighting may be via color, where the highlight color corresponds to the color of the waveforms currently being displayed.

11 Claims, 4 Drawing Sheets

(56) References Cited

U.S. PATENT DOCUMENTS

| | | | |
|---|---|---|---|
| 2002/0030683 A1* | 3/2002 | Alexander | 345/440.1 |
| 2002/0193895 A1* | 12/2002 | Qian et al. | 700/94 |
| 2003/0208328 A1* | 11/2003 | Pickerd | 702/67 |
| 2003/0220753 A1* | 11/2003 | Pickerd et al. | 702/67 |
| 2004/0183818 A1 | 9/2004 | Beasley | |
| 2005/0175079 A1* | 8/2005 | Gamper et al. | 375/228 |
| 2005/0234670 A1* | 10/2005 | Hagen et al. | 702/85 |
| 2007/0248122 A1* | 10/2007 | Hamilton | 370/503 |
| 2010/0141657 A1* | 6/2010 | Gamper et al. | 345/440.1 |
| 2012/0089935 A1* | 4/2012 | Santori et al. | 715/771 |

FOREIGN PATENT DOCUMENTS

| | | |
|---|---|---|
| EP | 1956379 A1 | 8/2008 |
| JP | 2009025160 A | 2/2009 |

OTHER PUBLICATIONS

"WavePro DSO Operator's Manual", LeCroy Corporation, Jan. 2002, pp. i-16.20.

* cited by examiner

METHOD OF GROUPING WAVEFORMS FOR A SINGLE CHANNEL ON A SINGLE DISPLAY

CROSS-REFERENCE TO RELATED APPLICATIONS

The present invention claims the priority filing date of U.S. Provisional Patent Application Ser. No. 61/480,280 filed Apr. 28, 2011 by Ian S. Dees, et al entitled "Method for Grouping Waveforms From Multiple Spectrum Analyzer Channels on a Single Display," which Provisional Patent Application is incorporated herein by reference.

BACKGROUND OF THE INVENTION

The present invention relates to graphical indicia related to displayed waveforms, and more particularly to a method of grouping waveforms representing a single channel on a single display, such as multiple frequency or time domain waveforms derived from a single input signal.

Traditional spectrum analyzers map one input channel to multiple on-screen frequency domain waveforms that are all derived from that input channel. For example a spectrum analyzer might simultaneously display waveforms representing: (i) the live signal, often labeled as Normal; (ii) an average of the live signal with prior signals, often labeled as Average; and (iii) maximum and minimum comparisons of the live signal with prior signals, often labeled as Max Hold and Min Hold, respectively. Since these signals are derived from the same input channel, they are typically displayed on a single vertical scale on a display screen.

Unlike traditional spectrum analyzers, oscilloscopes display signals from multiple input channels on the same graticule of a display screen. This is achieved by assigning each channel its own separate vertical position and scale so that the waveforms may be independently positioned on the display screen. Likewise an oscilloscope may map one input channel to multiple on-screen time domain waveforms that are all derived from that input channel, each waveform being displayed in its own separate vertical position and scale.

What is desired is a method of displaying multiple waveforms derived from a single input channel simultaneously on a display screen with grouping indicia to indicate what waveforms are being displayed as well as which one is active for measurements.

BRIEF SUMMARY OF THE INVENTION

Accordingly the present invention provides a method of grouping multiple waveforms derived from a single input channel with a graphic indicia that indicates to a user what waveforms are being displayed as well as which one of the waveforms is active for measurements. The graphic indicia is in the form of an icon along a margin of a display area of a display screen, which icon has a first portion with a symbol indicating the single channel and with an indicator defining a baseline for the display area. The icon also has a second portion with symbols indicating which of the multiple waveforms currently are being displayed on the display area. When a waveform function is selected, a menu is shown on the display screen, indicating what different waveforms are available for the single channel. From the menu a user may select which waveforms to display on the display area, either turning "on" the waveform to display it or turning "off" a waveform to remove it from the display area. Also from the menu the user may select which of the displayed waveforms is active for processing. The symbol for the single channel and the symbol for the waveform that is active for processing are highlighted. The highlighting may be via color, where the highlight color corresponds to the color of the waveforms currently being displayed.

The objects, advantages and other novel features of the present invention are apparent from the following detailed description when read in conjunction with the appended claims and attached drawing figures.

DETAILED DESCRIPTION OF THE INVENTION

Figure 4:
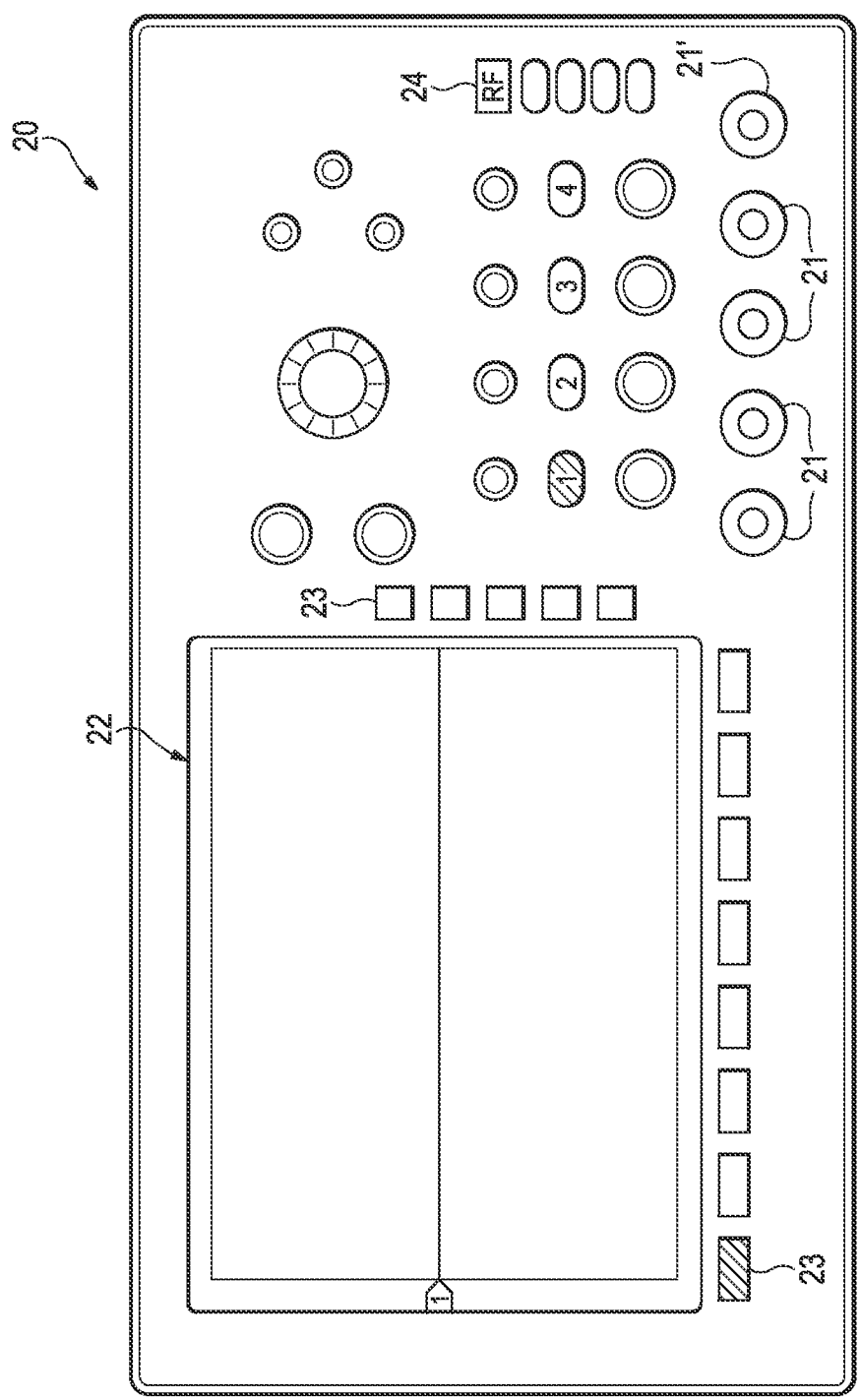
FIG. 4 is a plan view of a typical multi-channel oscilloscope front panel having at least one radio frequency (RF) input channel that practices the present invention.

A test and measurement instrument for practicing the present invention is an oscilloscope, such as shown in FIG. 4, which is capable of displaying both frequency and time domain waveforms from multiple input channels. As indicated above, multiple waveforms may be generated for data acquired from any particular one of the input channels. For the purposes of illustration, the following description deals with the display of frequency domain waveforms derived from a single input channel, but is equally applicable to the display of time domain waveforms derived from a single input channel.

Figure 1:
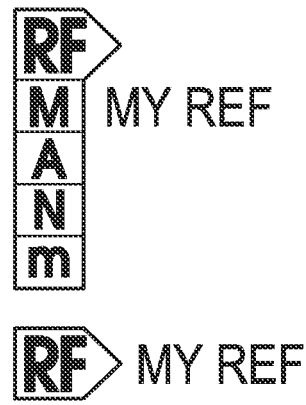
FIG. 1 is a plan view of an illustrative example of signal groupings according to a first embodiment of the present invention.
Figure 2:
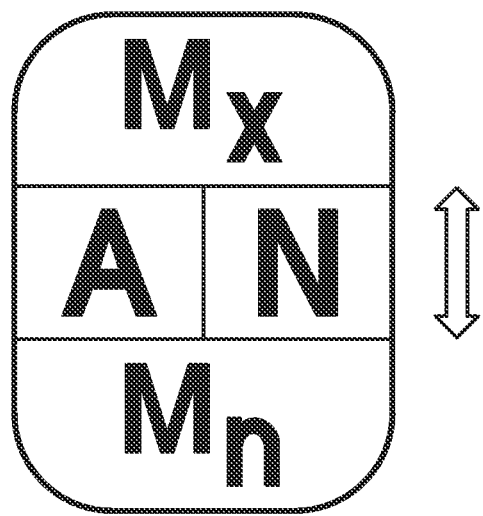
FIG. 2 is a plan view of an illustrative example of a graphic indicia for displaying signal groupings on a display screen according to a first embodiment of the present invention.

For frequency domain waveforms, such as from a radio frequency (RF) signal input channel, all of the waveforms generated from the single input channel—Normal (N), Average (A), Max Hold ($M_x$), Min Hold ($m_n$) as listed by the icon of FIG. 2—are displayed on a single common vertical scale particular to that input channel. In other words, each input channel has its own independent vertical scale and position settings, which apply identically to all the waveforms generated from that input channel, as shown in FIG. 1 by way of illustration.

Figure 3:
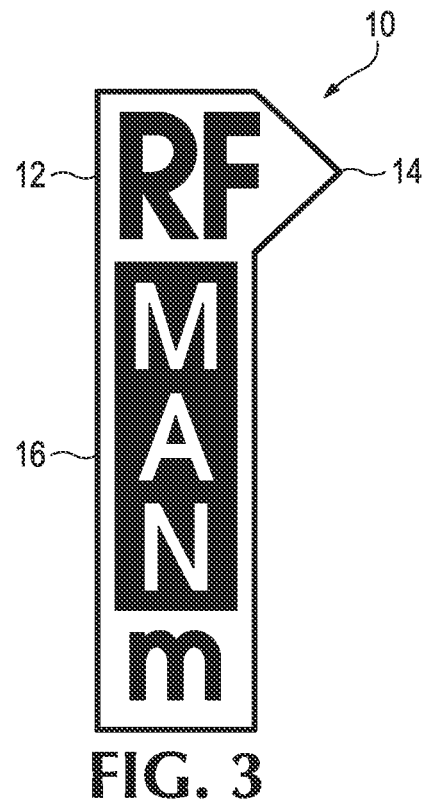
FIG. 3 is a plan view of an illustrative example of a graphic indicia for displaying signal groupings on a display screen according to a second embodiment of the present invention.

Referring now to FIGS. 2 and 3 any icon used provides a baseline indicator or graphic indicia for each input channel. The baseline indicator indicates which waveforms are currently being generated. Specifically it contains one or more letters indicating which waveforms are being displayed for that input channel, such as N for Normal, A for Average, M for Max Hold and m for Min Hold. The baseline indicator also indicates which of the waveforms is currently selected by highlighting the appropriate matching letter. The selected waveform is the one that is subject to other waveform operations by the oscilloscope, such as measurements. Finally the baseline indicator indicates the vertical position of all the waveforms generated from the corresponding input channel by containing an indicia that defines a point, such as the top, of the vertical axis for the graticule.

Preferably the baseline indicator and all waveforms related for the specific input channel are colored with similar hues to make clear their relationship to one another. The intensity of the particular selected waveform within the group may be enhanced to clearly tie that waveform with the selection indicated by the baseline indicator.

FIG. 3 shows the baseline indicator 10 or graphic indicia (icon) having a top portion 12 with a label indicative of the input channel (RF in this instance) and a triangle with a point 14 to indicate a vertical reference level for that input channel display. Below the top portion 12, or head, is a columnar portion 16 which has different indicia to indicate the types of waveforms being shown for the selected input channel, i.e., for RF waveforms typical choices are "N" (Normal), "M" (Max Hold), "A" (Average) and "m" (min hold). The input channel and particular type of waveform being processed or measured at the present time for the selected channel is indicated by the use of color, which color may also correspond to the particular color of the waveforms being displayed for that channel, or other means of highlighting.

Figure 5:
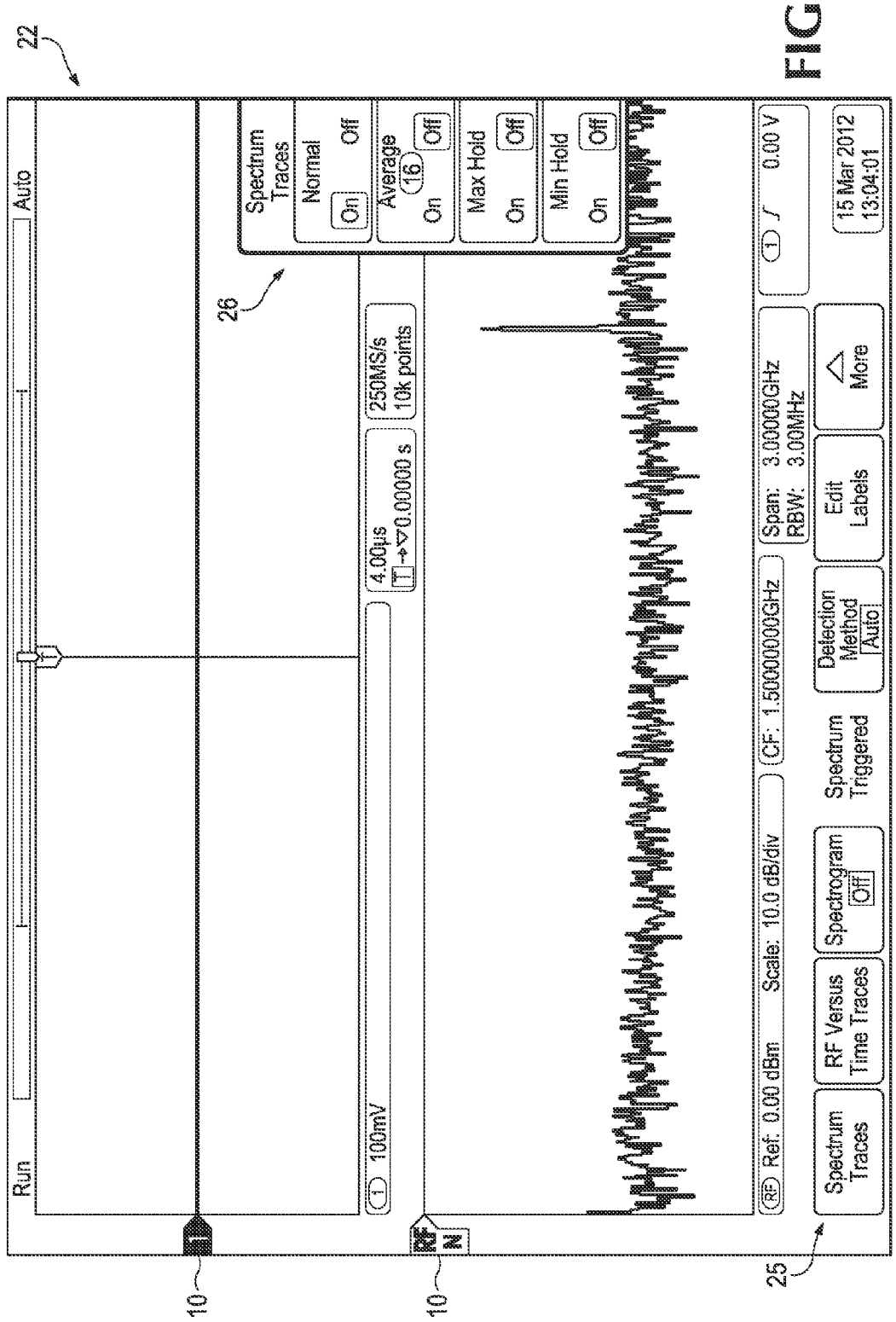
FIG. 5 is a plan view of the display screen for the oscilloscope of FIG. 4 showing an initial waveform display for a single channel input according to the present invention.

An oscilloscope 20 is shown in FIG. 4 having multiple time domain input channels 21 and an RF input channel 21'. A display screen 22 is shown in a default setup, i.e., no input channel selected but with an indicia for input channel "1". Along the side and bottom of the display screen 22 are a series of activation buttons 23 for performing functions related to related menus as they are produced on the display screen. For the RF input channel 21' there are buttons related to that channel, including a selection RF button 24 for selecting the RF channel for display. Activation of the RF button 24 causes the signal on the RF channel 21' to be acquired and displayed, as shown in FIG. 5. The display screen 22 is divided into upper and lower portions, with the RF acquired data being shown in the lower portion with an appropriate graphic indicia at the left. The upper portion of the display screen 22 is left available for displaying acquired waveform data from another of the input channels 21, which in this example is the original default channel "1" as indicated by the graphic indicia 10 at the left—only the channel label is shown since no signal is currently being displayed for that channel and the channel label is not highlighted since it is not the active channel.

Referring now to the bottom portion of the display screen 22 of FIG. 5, the icon 10 is shown at the top of the bottom portion to provide a vertical reference level for the display area applicable to the RF acquired waveform data. Soft buttons 25 along the bottom of the display screen 22 correspond to the activation buttons 23 along the bottom of the display screen, shown in FIG. 4. What is shown is the normal display of the acquired RF waveform data, so the icon 10 in its top portion 12 indicates that the "RF" channel is being displayed and the "N" in the bottom portion 16 of the icon indicates that the normal waveform is being displayed. By pushing the activation button 23 corresponding to "Spectrum Traces" soft button 25 along the bottom of the display screen 22, a Spectrum Traces menu 26 appears along the right side of the screen with options aligned with the activation buttons 23 along the side of the screen, shown in FIG. 4. Initially only the Normal waveform is indicated as being "On", while the other possible waveforms for the RF channel are indicated as being "Off". Activation of the side activation buttons 23 will result in the corresponding display modes being either turned "On", selected for processing or measurement, or turned "Off" (if already On).

As each side activation button 23 is pressed to turn on additional display waveforms for the acquired RF data, the bottom portion 16 of the icon 10 will add another indicia to the icon to indicate the active displayed waveforms being shown. The Spectrum Traces menu 26 also reflects the status of the displayed waveforms accordingly. When all of the displayed waveforms are being displayed for the RF channel, activating the side activation buttons 23 will select the particular display waveform to be processed or measured. Pressing and holding the side activation button 23 for an already ON waveform turns off the particular displayed waveform and removes that waveform from the display screen 22. Alternatively pressing the side activation button 23 twice, once to select the waveform and the second time to turn off the waveform, also removes that waveform from the display screen 22. At all times the icon 10 indicates which waveforms are being shown and which particular one of the displayed waveforms is being processed. The particular active waveform for the RF channel may also be differentiated from the other waveforms by changing the intensity of the waveform, such as by changing the saturation of the color of the waveform.

Figure 6:
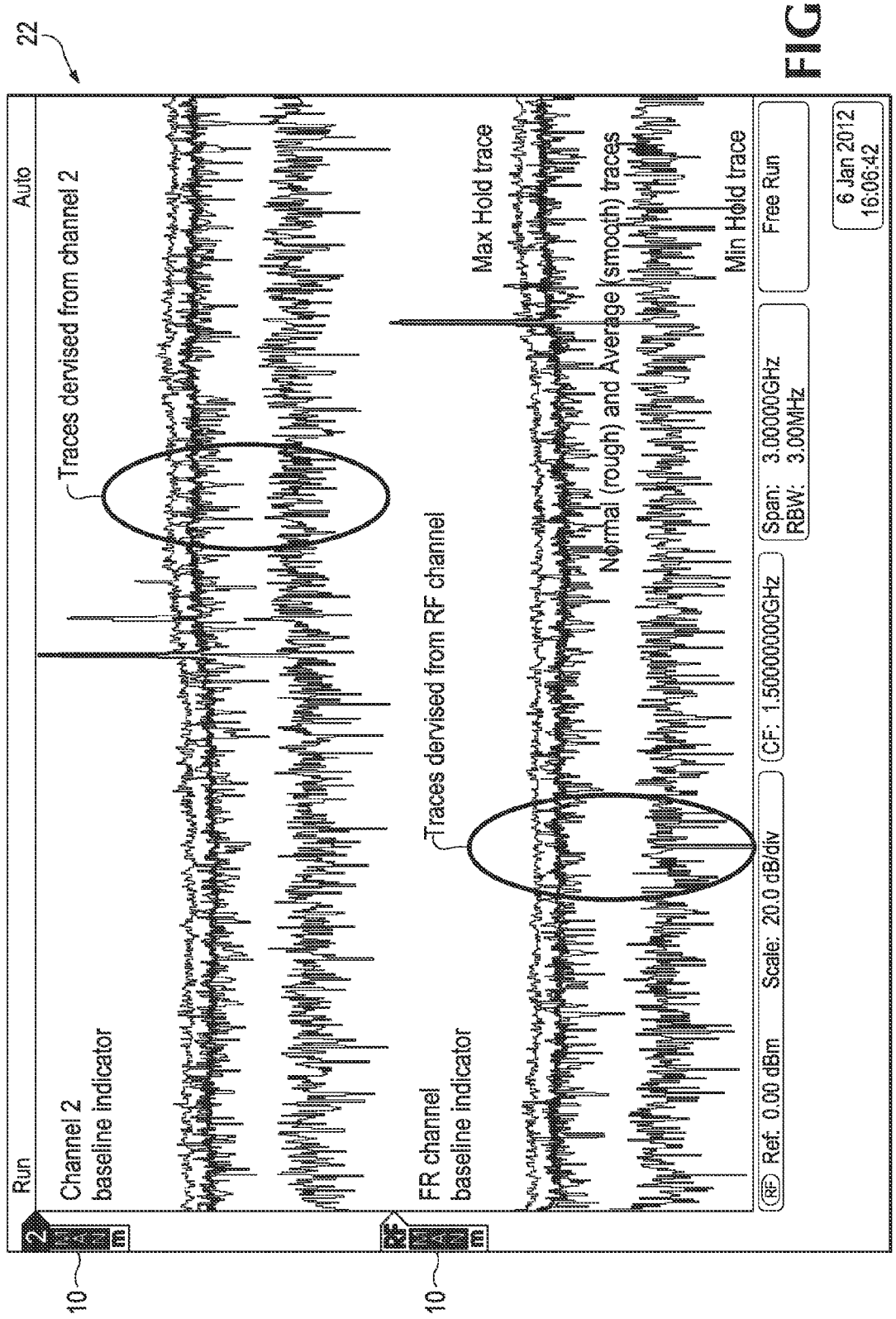
FIG. 6 is a plan view of the display screen for the oscilloscope of FIG. 4 showing a dual channel display according to the present invention.

FIG. 6 shows a portion of the display screen 22 where two channels—in this example time domain channel "2" and the RF channel—have been selected for display. In this instance there are two icons 10, one for each channel, with the head or top portion 12 indicating the particular channel and the arrow portion 14 indicating the vertical reference or top of the display area for that particular channel display. Also the bottom portions 16 for each of the icons 10 indicates what the particular waveforms represent for the respective channels— M, A, N, m—and which of the waveforms is currently selected. The input channel selected is highlighted in the corresponding icon 10, and the particular waveform within that channel also is highlighted. The color of the waveforms match the color for the corresponding channel icon 10, i.e., the waveforms in the top portion of the display of FIG. 6 may be green, and the icon is then displayed in green when the channel is selected, and the waveforms in the bottom portion of the display may be orange. If more channels are receiving signals, then the display screen 24 may be divided into additional display areas, one for each receiving channel, although only one channel is active for processing at any time.

Thus the present invention provides a means of grouping waveforms for a single channel on a single display area of a display screen by providing an icon that has a portion with indicia of the selected channel and an indicator to provide a baseline for the display area as well as a related portion for indicating which waveforms for the selected channel are being displayed and which one of the waveforms is active for processing or measurement.

What is claimed is:

1. A method of grouping multiple waveforms for a single channel of acquired data on a display area of a display screen comprising the steps of:

displaying a normal waveform for the acquired data on the display area;

providing an icon having a first portion with a channel symbol indicative of the single channel and with an indicator situated on the display screen to define a baseline for the display area, and having a second portion with a waveform symbol indicative of the normal waveform;

providing a menu on the display screen indicating multiple different waveforms available for the acquired data; and activating from the menu ones of the multiple different waveforms desired for display on the display area, wherein in response to the activation from the menu of one of the multiple different waveforms available for the acquired data, a waveform symbol indicative of the activated waveform is added to the icon in the second portion, and the second portion of the icon has different waveform symbols for each of the different waveforms activated for display.

2. The method of claim 1 further comprising the step of selecting one of the different waveforms activated for display as an active waveform for processing.

3. The method of claim 2 further comprising the step of:
highlighting one of the waveform symbols in the icon corresponding to the active waveform.

4. The method of claim 3 wherein the highlighting step comprises the step of highlighting the one of the waveform symbols with a color corresponding to a waveform color for the waveforms currently being displayed on the display area.

5. The method of claim 1 further comprising the step of turning off ones of the different waveforms currently being displayed which are no longer desired to be displayed on the display area.

6. The method of claim 1 further comprising the step of:
selecting one of a plurality of channels of acquired data for display in the displaying step;
indicating in the first portion of the icon with a corresponding channel symbol the selected one of the channels for which the acquired data is being displayed.

7. The method of claim 6 further comprising the step of:
displaying a second one of the plurality of channels of acquired data in a second display area of the display screen with a second icon associated with the second display area having a second channel symbol corresponding to the displayed second one of the plurality of channels; and
highlighting the channel symbol in the icon associated with the one of the plurality of channels being displayed as an active channel for processing.

8. The method as recited in claim 7 wherein the highlighting step comprises the step of highlighting the channel symbol associated with the active channel with a color corresponding to a waveform color for the waveforms currently being display on the display area associated with the active channel.

9. A graphic icon for grouping a plurality of waveforms representing acquired data for a single channel on a display area of a display screen comprising:
a first portion having a channel symbol corresponding to the single channel and having an indicator situated on the display screen to define a baseline for the display area; and
a second portion having waveform symbols corresponding to the plurality of waveforms, the particular waveform symbols displayed in the second portion corresponding to which of the plurality of waveforms currently are being displayed on the display area.

10. The graphic icon of claim 9 wherein the channel symbol is highlighted when the single channel is selected for processing, and wherein one of the particular waveform symbols is highlighted indicating which one of the currently displayed plurality of waveforms is selected for processing.

11. The graphic icon of claim 10 wherein the highlighting comprises a color corresponding to a waveform color for the waveforms currently being displayed on the display area.

* * * * *